United States Patent
Saracco

(10) Patent No.: US 7,667,567 B2
(45) Date of Patent: Feb. 23, 2010

(54) HIGH PRECISION VOLTAGE MEASURING PASSIVE NETWORK

(76) Inventor: Ronald Alfred Saracco, 1030 Jennings Rd., Fairfield, CT (US) 06824

( * ) Notice: Subject to any disclaimer, the term of this patent is extended or adjusted under 35 U.S.C. 154(b) by 510 days.

(21) Appl. No.: 11/786,687

(22) Filed: Apr. 11, 2007

(65) Prior Publication Data
US 2007/0252673 A1 Nov. 1, 2007

Related U.S. Application Data

(60) Provisional application No. 60/791,505, filed on Apr. 12, 2006.

(51) Int. Cl.
*H01C 10/32* (2006.01)
(52) U.S. Cl. .................. 338/162; 338/15; 338/176; 324/74; 324/601; 341/146
(58) Field of Classification Search .............. 338/15, 338/176, 202, 260, 162; 324/74, 601, 664, 324/667; 341/146, 153; 374/168, 170; 307/43.52
See application file for complete search history.

(56) References Cited

U.S. PATENT DOCUMENTS

| | | | | | |
|---|---|---|---|---|---|
| 3,123,753 | A | * | 3/1964 | Kerrns et al. | 318/685 |
| 3,416,084 | A | * | 12/1968 | Loebe | 324/98 |
| 5,446,374 | A | * | 8/1995 | Pradel | 324/142 |
| 5,519,396 | A | * | 5/1996 | Distinti | 341/153 |
| 5,542,279 | A | * | 8/1996 | Erdman et al. | 73/1.88 |

* cited by examiner

*Primary Examiner*—Kyung Lee
(74) *Attorney, Agent, or Firm*—Alfred A. Fressola; Ware, Fressola, Van Der Sluys & Adolphson LLP

(57) ABSTRACT

A voltage divider for high precision voltage measurement has one or more pair of potentiometers. The wipers of each pair of potentiometers are ganged so that the sum of their resistances relative to a first end of the respective potentiometer is a constant. An output potentiometer or a pair of resistors provide an output for measuring the output voltage. The resolution of the voltage divider is the product of the resolution of each potentiometer pair and the output potentiometer.

6 Claims, 1 Drawing Sheet

HIGH PRECISION VOLTAGE MEASURING PASSIVE NETWORK

CROSS REFERENCE TO RELATED APPLICATIONS

This application claims priority under 35 USC §119 to U.S. Provisional Patent Application No. 60/791,505 filed on Apr. 12, 2006.

BACKGROUND OF THE INVENTION

The present invention relates to a voltage divider and in particular to voltage dividers with high precision.

SUMMARY OF THE INVENTION

The present invention is directed to a voltage divider that uses a passive network and that can resolve voltages with high precision. The voltage precision has been found to be as high as one part in $10^9$ or possibly higher. The passive network uses a first set of potentiometers of equal value having wipers that are mechanically ganged to each other on a common shaft. In addition, a second set of potentiometers of equal value also share a common shaft so that their respective wipers are mechanically ganged to each other.

An additional potentiometer is configured with a single wiper representing an output voltage that has a linear function of any wiper shaft angle.

In particular, an electrical passive network is described comprising one or more pairs of potentiometers which have wipers that are mechanically or electronically ganged to each other so as to effectively form resistance values that add to a constant value. The first pair of potentiometers is configured to connect to an input voltage source. The output of the potentiometer wipers are tied to either a second pair of potentiometers or to an output potentiometer having a wiper representing an output voltage. If a ganged pair of potentiometers is tied to the preceding pair, then the output of the ganged pair is tied to either another ganged pair of potentiometers or to a single potentiometer bridging the wipers and having its own wiper representing an output voltage.

The ganging of the potentiometers is such that the combined resistance of the potentiometer as read from the wipers relative to the applied voltage, is constant. Thus, if the resistance at the wiper of the first potentiometer of a potentiometer pair increases, the resistance at the wiper of the second potentiometer of that same potentiometer pair correspondingly decreases as the ganged wipers are adjusted.

The overall result is that the output voltage is linearly related to the input voltage and has a large dynamic range based upon the combined wiper resistance value of each of the potentiometer pairs. The overall result therefore provides for the output voltage to be a linear function of one or more potentiometer pairs which can have a dynamic range of up to, one billion or even higher depending upon the practical limitations of the resistance values of the potentiometers for each succeeding potentiometer pair.

The overall voltage divider is practical for use as a multiplying device. That is, if the input voltage is adjusted by, for example, one order of magnitude (10:1), the dynamic range will increase to $10^{10}$ for an example where the original dynamic range is $10^9$.

The voltage divider is practical as only potentiometers and possibly resistors are used which allow for the elimination of any active elements.

The voltage divider can therefore precisely position various types of devices where the output voltage needs to be linearly related to an input voltage over a wide dynamic range. Applications include telescope positioning which can have a resolution in the nanoradian range. Other applications include the adjustment of an output voltage for a one volt input to within one nanovolt and thus can be used to simulate thermocouple output such as 6 microvolts per degree centigrade and biomedical voltages that range from 0.1 microvolt to 5 millivolts.

DETAILED DESCRIPTION

Figure 1:
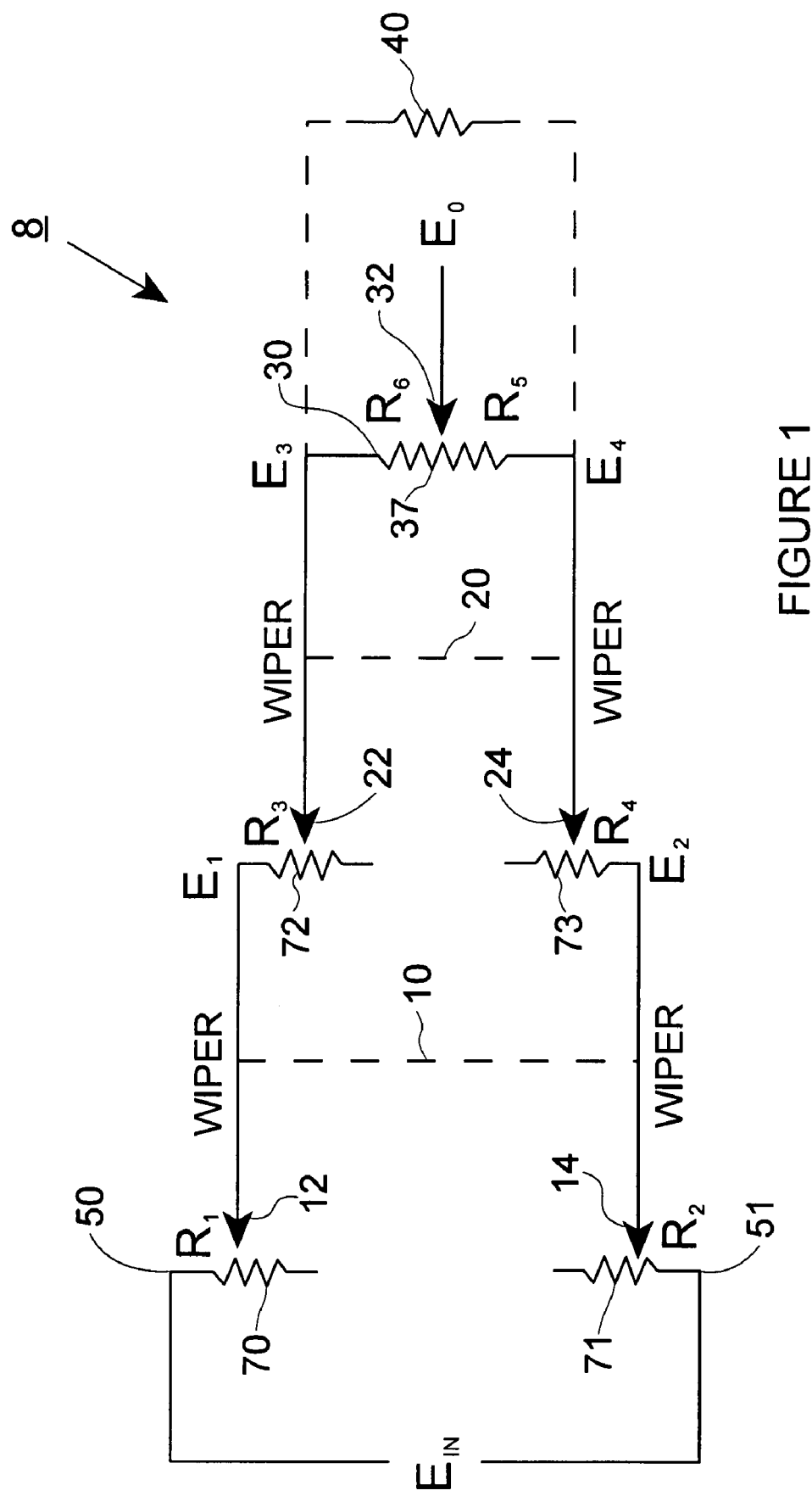
FIG. 1 is a schematic of the electrical components forming a preferred embodiment of the voltage divider according to the present invention.

FIG. 1 is a representative embodiment of a voltage divider 8 according to the present invention in which input voltage $E_{IN}$ is measured at output $E_O$.

In the embodiment shown in FIG. 1, voltages can be resolved to within 0.000000001 parts. The difference voltages E1 and E2 and the difference voltages E3 and E4 remain constant for a constant voltage $E_{IN}$ at the input.

Potentiometers 70 and 71 forming a first pair of potentiometers have substantially equal overall resistance values with wipers 12 and 14 mechanically ganged to each other on a common shaft 10. The resistance value $R_1$ is the resistance between outer leg 50 of potentiometer 70 and the point where wiper 12 contacts potentiometer 70. Similarly, resistance value $R_2$ is the resistance between outer leg 51 of potentiometer 71 and the point where wiper 14 contacts the potentiometer 71. Similarly, potentiometers 72 and 73 forming a second (additional) pair of potentiometers have substantially equal overall resistance values and share a common shaft 20 so that their respective wipers 22 and 24 are mechanically ganged to each other. Resistors R5 and R6 combine to form a single additional potentiometer 30 having a single wiper 32. Potentiometer 30 can be implemented as two discrete resistors having a common point 37 (where wiper 32 is shown in FIG. 1). Potentiometers 30 and 70-73 can be analog potentiometers or digital potentiometers. The wipers of these potentiometers can be mechanically or electronically ganged so that the combined resistance values for each potentiometer pair is substantially constant as the respective wipers move for each potentiometer pair (that is, for example, if $R_1$ increases by turning shaft 10, then resistance $R_2$ correspondingly decreases so that $R_1 + R_2 = $ a constant). For digital potentiometers, the wiper "positions" are electronically set. Such is well known to those skilled in the art.

In this configuration, the output $E_O$ is a linear function of any wiper shaft angle. Furthermore, as can be seen by Table 1, the output voltage $E_O$ is a linear function of the input voltage due to the fact that the total resistance RT associated with the equation for determining $E_O$ is constant for all settings of any of the potentiometers.

It should be noted that although in FIG. 1 analog potentiometers are shown, the invention is also applicable for digital potentiometers whose wipers are controlled electronically. Also, although two potentiometer pairs are shown, only one pair is required while additional potentiometer pairs may be used depending upon the desired overall resolution of the voltage divider.

Furthermore, voltages E1, E2, E3 and E4 and the output voltage $E_O$ are described by the equation as set forth in Table 1.

TABLE 1

$$E_1 = \frac{E_{IN}(R_2 + R_3 + R_4 + R_5 + R_6)}{(R_1 + R_2 + R_3 + R_4 + R_5 + R_6)} \quad \text{Eq. 1}$$

$$R_T = R_1 + R_2 + R_3 + R_4 + R_5 + R_6 \quad \text{Eq. 2}$$

$$E_2 = \frac{E_{IN}(R_2)}{R_T} \quad \text{Eq. 3}$$

$$E_1 - E_2 = \frac{E_{IN}(R_3 + R_4 + R_5 + R_6)}{R_T} \quad \text{Eq. 4}$$

The difference voltage ($E_1 - E_2$) is independent of wiper settings $$E_3 = \frac{E_{IN}(R_2 + R_4 + R_5 + R_6)}{R_T} \quad \text{Eq. 5}$$

$$E_4 = \frac{E_{IN}(R_2 + R_4)}{R_T} \quad \text{Eq. 6}$$

The difference voltage ($E_3 - E_4$) is independent of wiper settings $$E_3 - E_4 = \frac{E_{IN}(R_5 + R_6)}{R_T} \quad \text{Eq. 7}$$

$$E_O = \frac{E_{IN}(R_2 + R_4 + R_5)}{R_T} \quad \text{Eq. 8}$$

Resolution and Potentiometer Value Determination

The following example illustrates the relationship between $E_O$ and $E_{IN}$ based upon various resistance values associated with the potentiometer shown in FIG. 1. Example: If potentiometers 70 and 71 each have an overall resistance of 1 meg ohm and if each has a resolution of 0.1% or 1,000 ohms, the resolution of potentiometers 70 and 71 determines the overall resistance of potentiometers 72 and 73, which is 1,000 ohms. If potentiometers 72 and 73 each have a resolution of 0.1% or 1 ohm, that value determines the overall resistance of potentiometer 30 (resistances R5+R6) to be 1 ohm. Therefore, the overall resolution of the voltage divider is one part in $10^9$ ($10^3 \times 10^3 \times 10^3$). The linear resolution relative to each of the potentiometers is set forth by the equations in Table 1.

Furthermore, if a 1 ohm potentiometer is not a practical value for potentiometer 30, a resistor 40 may be placed across potentiometer 30 (or resistors R5 and R6). Thus, if resistors R5+R6 is 50 ohms (or potentiometer 30 has a total resistance of 50 ohms) and the desired value is 1 ohm, then a parallel resistor 40 of 50/49 ohms is placed across R5 and R6 as shown in phantom in FIG. 1, so that the total resistance is equal to 1 ohm. This does not alter the linearity of the resolution of a potentiometer 30.

Thus, what has been described is a voltage divider circuit which is a passive network capable of resolving voltages with a very high precision. Applications for this voltage divider include, for example, measurement and calibration of voltages. Since the resolution of the shaft positions of ganged shafts 12, 14 and 22, 24 and that of wiper 32 cause a linear change in the output voltage $E_o$, the voltage divider can be used to make high resolution position changes in output angular positioning systems such as used with telescope mounts, etc. The linear voltage and high precision output voltage $E_o$ can also be used to simulate the output voltage of thermocouples and the like.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A voltage divider for high resolution voltage determination comprising:

a first pair of potentiometers each having a wiper that has substantially the same resolution and configured so that said wipers move together for any change in wiper position, wherein said first pair of potentiometers are configured for connecting a first end of each potentiometer to an input voltage $E_{IN}$ and configured so that the resistance between the wiper and said first end of one potentiometer of said first pair of potentiometers plus the resistance between the wiper and said first end of the other potentiometer of said first pair of potentiometers is substantially constant;

N additional pair of potentiometers each potentiometer of a pair of said N additional pair of potentiometers having a wiper that has substantially the same resolution, so that said wipers move together for any change in wiper position, wherein a first end of each potentiometer of said additional pair of potentiometers is respectively connected to the wiper of a respective one of the potentiometers of said first pair of potentiometers or to a preceding one of said N pair of additional potentiometers and configured so that the resistance between the wiper and said first end of one potentiometer of said additional pair of potentiometers plus the resistance between the wiper and said first end of the other potentiometer of said additional pair of potentiometers is substantially constant, where N is an integer equal to or greater than zero;

an additional potentiometer having an overall resistance value with first and second ends respectively connected to the wipers of said a last pair of said N additional pair of potentiometers, wherein the additional potentiometer has a wiper so as to define an output voltage $E_o$.

2. The voltage divider of claim 1, where N=1 and wherein the output voltage $E_o$ is defined by the equation:

$$E_O = \frac{E_{IN}(R_2 + R_4 + R_5)}{R_T}$$

wherein $R_T = R_1 + R_2 + R_3 + R_4 + R_5 + R_6$ wherein $R_1, R_2, R_3, R_4$, are the respective resistance values at the wipers of the first potentiometer pair and the additional pair of potentiometers and $R_5$ and $R_6$ are the resistance values between the wiper of the additional potentiometer and the respective wiper that said additional potentiometer is connected to.

3. The voltage divider of claim 1, comprising two discrete resistors connected in series in substitution for the additional potentiometer and the connection between said two resistors representing the output voltage $E_o$.

4. The voltage divider of claim 1, wherein at least one of the potentiometers is a digital potentiometer.

5. The voltage divider of claim 1, wherein the overall resistance of each potentiometer in at least one of said pair of potentiometers is substantially the same.

6. The voltage divider of claim 1, wherein the overall resistance of each potentiometer of a pair of potentiometers is approximately equal to an overall resistance of a potentiometer of an immediately preceding potentiometer pair divided by the resolution of the wiper of a potentiometer of said preceding potentiometer pair.

* * * * *